US012660597B2

(12) United States Patent
Nakajima

(10) Patent No.: US 12,660,597 B2
(45) Date of Patent: Jun. 16, 2026

(54) SEMICONDUCTOR DEVICE AND METHOD OF MANUFACTURING SEMICONDUCTOR DEVICE

(71) Applicant: Kioxia Corporation, Minato-ku (JP)

(72) Inventor: Akira Nakajima, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 375 days.

(21) Appl. No.: 18/333,590

(22) Filed: Jun. 13, 2023

(65) Prior Publication Data

US 2024/0071928 A1    Feb. 29, 2024

(30) Foreign Application Priority Data

Aug. 31, 2022    (JP) ................................. 2022-138694

(51) Int. Cl.
H10W 20/41         (2026.01)
H10W 20/00         (2026.01)
        (Continued)

(52) U.S. Cl.
CPC ....... H10W 20/425 (2026.01); H10W 20/033 (2026.01); H10W 20/42 (2026.01); H10W 20/498 (2026.01)

(58) Field of Classification Search
CPC ......... H01L 23/53238; H01L 21/76843; H01L 23/5226; H01L 23/5228; H01L 23/53266; H01L 21/76883; H01L 2224/05026; H01L 2224/05082; H01L 2224/05546; H01L 2224/05562; H01L 2224/05568; H01L 2224/05573; H01L 2224/80895;
        (Continued)

(56) References Cited

U.S. PATENT DOCUMENTS 6,492,735 B1    12/2002    Matsubara
6,881,666 B2     4/2005    Kawano
        (Continued)

FOREIGN PATENT DOCUMENTS

JP        2001284449 A     10/2001
JP           3329380 B2     7/2002
        (Continued)

OTHER PUBLICATIONS

U.S. Appl. No. 17/940,000, First Named Inventor: Akira Nakajima; Title: "Semiconductor Device and Manufacturing Method Thereof"; filed Sep. 8, 2022.

*Primary Examiner* — Patricia D Valenzuela

(74) *Attorney, Agent, or Firm* — Holtz, Holtz & Volek PC

(57)        ABSTRACT

A semiconductor device according to the embodiment includes: a first interlayer insulating film; a lower wiring layer provided in the first interlayer insulating film; a second interlayer insulating film provided on the first interlayer insulating film and having a first trench provided therein; and an upper wiring layer provided in the first trench of the second interlayer insulating film and electrically connected to the lower wiring layer, wherein the upper wiring layer includes: a first barrier metal film provided in the first trench, and mainly composed of Ta; a second barrier metal film provided in the first trench via the first barrier metal film, and mainly composed of Ti; and a first conductive film provided in the first trench via the first barrier metal film and the second barrier metal film, and mainly composed of a first metal.

6 Claims, 12 Drawing Sheets

(51) Int. Cl.
    *H10W 20/40*           (2026.01)
    *H10W 20/42*           (2026.01)
(58) Field of Classification Search
    CPC ............. H01L 23/53223; H10F 39/811; H10F
        39/011; H10F 39/014; H10F 39/18;
        H10W 20/425; H10W 20/033; H10W
        20/42; H10W 20/498; H10W 72/90;
        H10W 72/921; H10W 72/923; H10W
        72/9415; H10W 72/942; H10W 80/312;
                            H10W 20/056
    See application file for complete search history.

(56)                References Cited

U.S. PATENT DOCUMENTS 6,900,539  B2      5/2005   Motoyama
    6,949,832  B2      9/2005   Kunishima et al.

9,076,793      B2     7/2015   Tanaka
    2003/0075752   A1*    4/2003   Motoyama ........ H01L 21/76844
                                                          257/306
    2004/0173905   A1     9/2004   Kamoshima et al.
    2006/0128148   A1*    6/2006   Takahashi ......... H01L 21/76864
                                                          438/650
    2023/0069025   A1     3/2023   Nakajima

FOREIGN PATENT DOCUMENTS

JP          3540302   B2     4/2004
    JP       2006216787   A      8/2006
    JP          3973467   B2     6/2007
    JP          4555540   B2     7/2010
    JP       2012039019   A      2/2012
    JP       2013128062   A      6/2013
    TW        200418124   A      9/2004
    TW        200636862   A     10/2006

* cited by examiner

SEMICONDUCTOR DEVICE AND METHOD OF MANUFACTURING SEMICONDUCTOR DEVICE

CROSS-REFERENCE TO RELATED APPLICATIONS

This application is based upon and claims the benefit of priority from the prior Japanese Patent Application No. 2022-138694, filed on Aug. 31, 2022, the entire contents of which are incorporated herein by reference.

FIELD

The present embodiment relates to a semiconductor device and a method of manufacturing the semiconductor device.

BACKGROUND

In recent years, in semiconductor devices such as LSIs having wiring that contains Cu, a method of forming a barrier metal film containing Ta on the side walls and bottom surface of the Cu wiring has been used to prevent the diffusion of Cu. It is also proposed to use Ti as a material for the barrier metal film.

Such a barrier metal film containing Ti as a main component is low in cost, and high reliability can be obtained by diffusion of the barrier metal film material itself into the Cu wiring. However, moisture in an interlayer insulating film oxidizes Ti in the barrier metal film during high-temperature processing after film formation. As a result, the resistance value of the wiring of the semiconductor device increases.

On the other hand, although the Ta itself, which is generally used as the barrier metal film, neither oxidize nor diffuse into the Cu wiring, the occurrence of migration of the Cu wiring cannot be sufficiently suppressed. Thus, the reliability of the semiconductor device becomes lower than when Ti is selected as the material of the barrier metal film.

DETAILED DESCRIPTION

An object of one embodiment is to provide a semiconductor device and a method of manufacturing the semiconductor device that can improve reliability while reducing wiring resistance.

A semiconductor device according to one embodiment includes:

a first interlayer insulating film;

a lower wiring layer provided in the first interlayer insulating film;

a second interlayer insulating film provided on the first interlayer insulating film and having a first trench provided therein; and an upper wiring layer provided in the first trench of the second interlayer insulating film and electrically connected to the lower wiring layer, wherein the upper wiring layer comprises:

a first barrier metal film provided in the first trench, and mainly composed of Ta;

a second barrier metal film provided in the first trench via the first barrier metal film, and mainly composed of Ti; and a first conductive film provided in the first trench via the first barrier metal film and the second barrier metal film, and mainly composed of a first metal.

The semiconductor device and a method of manufacturing the semiconductor device according to embodiments will be described in detail below with reference to the accompanying drawings. In addition, the present invention is not limited by these embodiments.

First Embodiment

Figure 1:
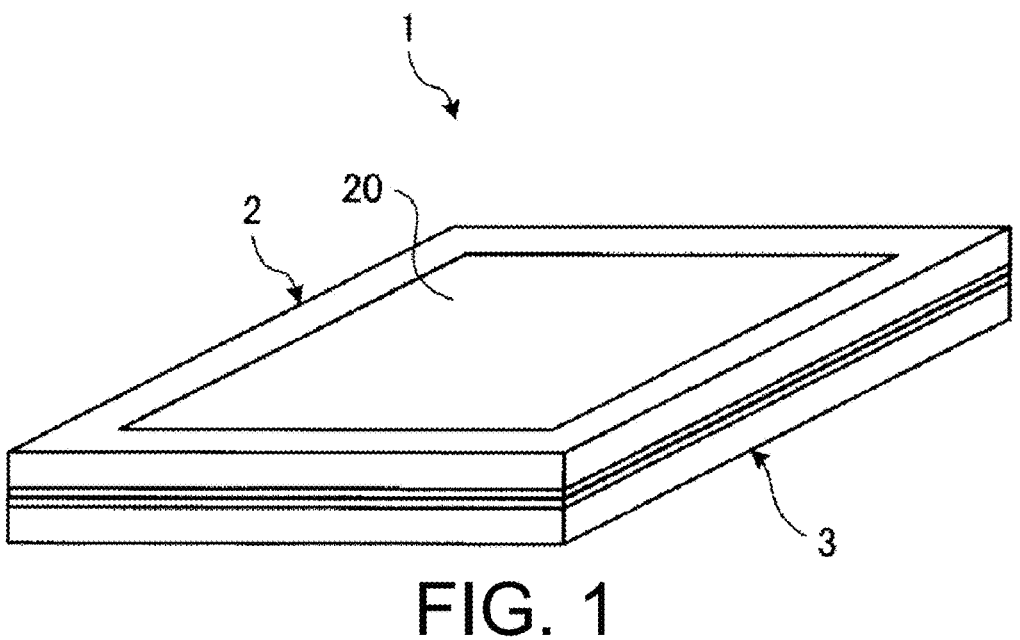
FIG. 1 is a perspective view showing a semiconductor device according to a first embodiment.
Figure 2:
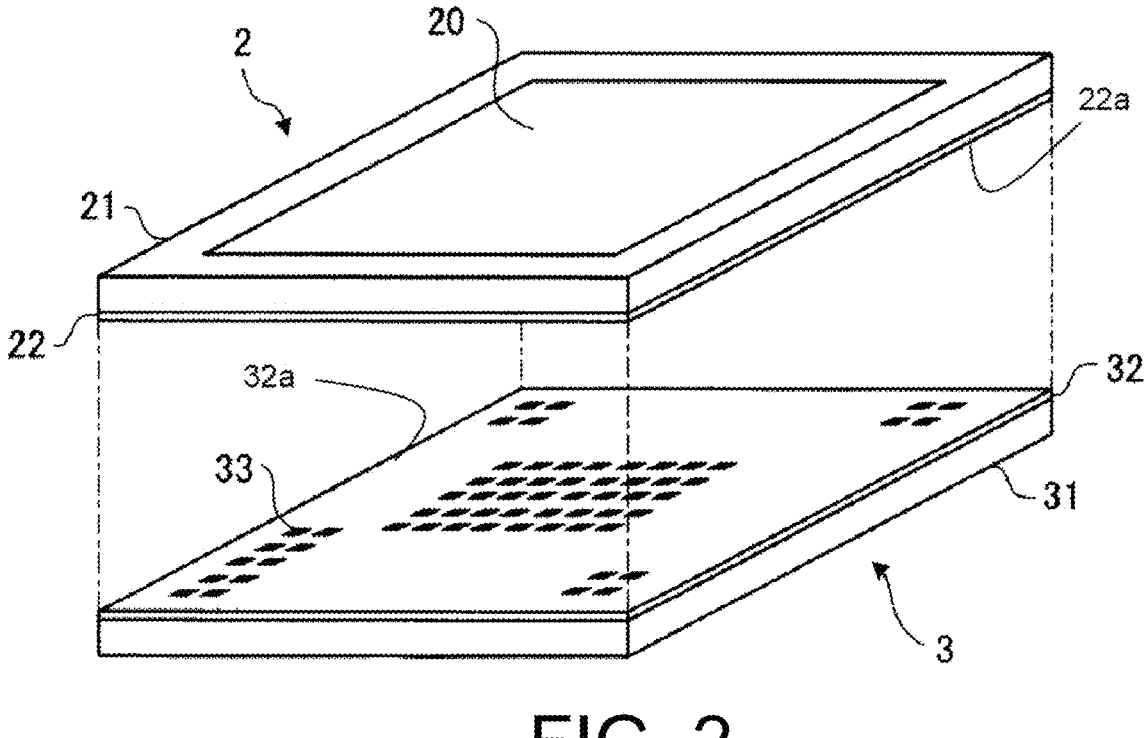
FIG. 2 is an exploded perspective view of the semiconductor device according to the first embodiment.
Figure 3:
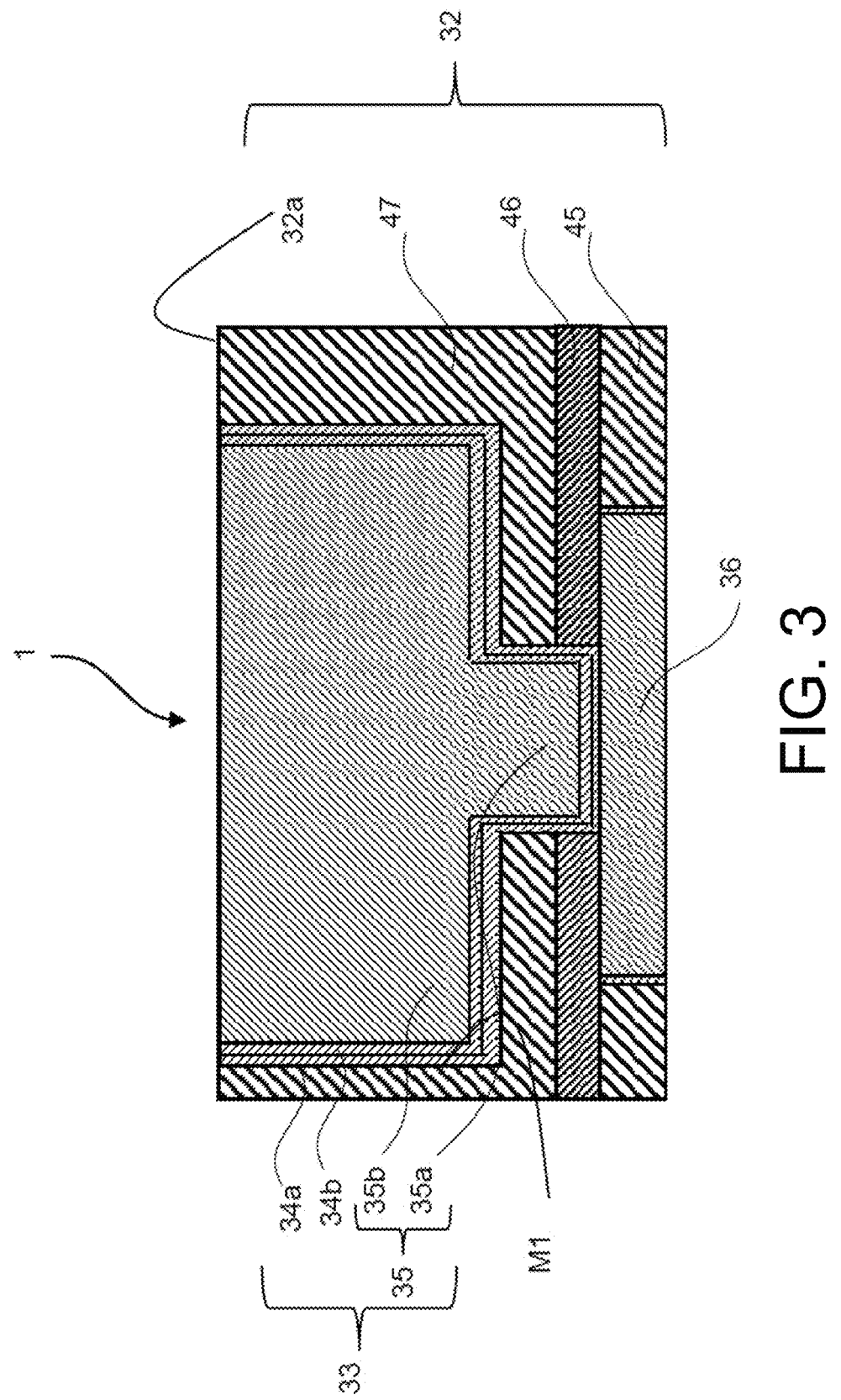
FIG. 3 is an explanatory diagram showing a cross-sectional structure of the semiconductor device according to the first embodiment.

FIG. 1 is a perspective view showing the semiconductor device according to a first embodiment. FIG. 2 is an exploded perspective view of the semiconductor device according to the first embodiment. FIG. 3 is an explanatory diagram showing the cross-sectional structure of the semiconductor device according to the first embodiment.

[Semiconductor Device]

For example, as shown in FIG. 1, a semiconductor device 1 includes a first substrate 3 and a second substrate 2 that are bonded together.

The first substrate 3 is, for example, a logic substrate that includes logic circuits that read image signals of captured images from the CMOS image sensor 20 and perform various signal processing on the read image signals.

Also, the second substrate 2 is, for example, a sensor substrate including a CMOS (Complementary Metal Oxide Semiconductor) image sensor 20 for imaging an object. The semiconductor device 1 may have a configuration in which a first logic substrate and a second logic substrate are bonded together, or may have a configuration in which a logic substrate and a memory substrate are bonded together. Also, the semiconductor device 1 may have a configuration in which three or more substrates are laminated.

Then, as shown in FIG. 2, the first substrate 3 comprises: a device layer 31 on which a logic circuit or the like is provided, and a first connection wiring layer 32 provided on the upper surface of the device layer 31 and including a plurality of metal electrodes and wiring. The electrode is embedded in the first connection wiring layer 32 with one end face exposed from the first connection wiring layer 32, and for example, is connected to a logic circuit or the like via wiring inside the device layer 31.

On the other hand, the second substrate 2 includes a device layer 21 on which a CMOS image sensor 20 and the like are provided, and a second connection wiring layer 22 provided on the lower surface of the device layer 21 and including a plurality of metal electrodes and wiring embedded in positions corresponding to the electrodes of the first substrate 3. The electrodes are embedded in the second connection wiring layer 22 with one end face exposed from the second connection wiring layer 22, and for example, connected to the CMOS image sensor 20 or the like via wiring inside the device layer 21.

The bonding surfaces of the second substrate 2 and the first substrate 3 are polished and flattened, and after the bonding surfaces are subjected to activation treatment, they are directly bonded without using an adhesive. As a result, the second substrate 2 and the first substrate 3 are temporarily bonded by hydrogen bonding due to an intermolecular force between the first connection wiring layer 32 and the second connection wiring layer 22. After that, the second substrate 2 and the first substrate 3 are subjected to heat treatment under predetermined conditions. Thereby, the second substrate 2 and the first substrate 3 are permanently bonded by covalent bonding between the first connection wiring layer 32 and the second connection wiring layer 22.

Thus, in the semiconductor device 1, the electrode provided on the lower surface of the CMOS image sensor 20 provided on the second substrate 2 and the electrode provided on the upper surface of the first substrate 3 can be connected. Therefore, for example, according to the logic circuit provided in the first substrate 3, it is possible to read signals from directly below the CMOS image sensor 20, so it is possible to reduce the area occupied by the substrate.

Here, in the first embodiment, a configuration in which the wiring resistance of the first connection wiring layer 32 including an upper wiring layer 33 applied to the electrodes, wiring, or the like, of the first substrate 3 of the semiconductor device 1 is reduced and in which the reliability is increased, will be described in more detail with an example. Details of the method of manufacturing the semiconductor device will be described later with reference to FIGS. 6 to 8. Likewise, the configuration of the second connection wiring layer 22 of the second substrate 2 will be described similarly.

Next, referring to FIG. 3, a cross-sectional structure of the semiconductor device 1 according to the first embodiment will be described. In FIG. 3, an area near the cross section of the first connection wiring layer 32 of the first substrate 3 is selectively illustrated.

Furthermore, for example, as shown in FIG. 3, the first connection wiring layer 32 of the first substrate 3 of the semiconductor device 1 according to the first embodiment includes a silicon oxide layer 45, a SiCN film 46, and a silicon oxide layer 47 which are stacked in order from the device layer 31 (See FIG. 2) side. In addition, in the present embodiment, the silicon oxide layer 45 constitutes the first interlayer insulating film. Furthermore, the SiCN film 46 and the silicon oxide layer 47 constitute a second interlayer insulating film. A lower wiring layer 36 connected to a device such as a logic circuit provided inside the device layer 31 (see FIG. 2) is provided inside the silicon oxide layer 45.

Thus, the semiconductor device 1 according to the first embodiment includes the first interlayer insulating film 45, the lower wiring layer 36, the second interlayer insulating films 46 and 47, and the upper wiring layer 33.

In addition, in the semiconductor device 1, in the case of a structure having a gap film such as a Co layer on the lower wiring layer 36, the SiCN film 46 of the second interlayer insulating films 46 and 47 becomes unnecessary and is configured to be omitted.

The lower wiring layer 36 is provided on the first interlayer insulating film 45. In this embodiment, the second metal (main element), which is the main component of the conductive film forming the lower wiring layer 36, is Cu, for example. The second metal (main element) that is the main component of the conductive film may be, for example, W or other metal such as Al.

Also, the second interlayer insulating films 46 and 47 are provided on the first interlayer insulating film 45, and the first grooves M1 are formed therein. As already mentioned, the second interlayer insulating films 46 and 47 include the SiCN film 46 and the silicon oxide layer 47.

Also, the upper wiring layer 33 is provided in the first grooves M1 of the second interlayer insulating films 46 and 47 and is electrically connected to the lower wiring layer 36.

For example, as shown in FIG. 3, the upper wiring layer 33 includes a first barrier metal film 34a, a second barrier metal film 34b, and a first conductive film 35.

The first barrier metal film 34a is a barrier metal film provided in the first trench M1 and containing Ta as a main component. The first barrier metal film 34a is, for example, a Ta film.

The second barrier metal film 34b is the barrier metal film containing Ti as a main component and formed in the first trench M1 via the first barrier metal film 34a.

Also, the first conductive film 35 is a conductive film mainly composed of a first metal provided in the first trench M1 via the first barrier metal film 34a and the second barrier metal film 34b. In this embodiment, the first metal (main element) that is the main component of the first conductive film 35 is Cu.

For example, as shown in FIG. 3, the first conductive film 35 is adjacent to the second barrier metal film 34b. Therefore, Ti contained in the second barrier metal film 34b diffuses (exists) in the first conductive film 35 by, for example, an annealing treatment to be described later. Thereby, occurrence of migration of Cu constituting the first conductive film 35 can be suppressed.

As mentioned above, the first metal (main element), which is the main component of the first conductive film 35, is Cu in this embodiment, but may be W or other metal such as Al.

For example, as shown in FIG. 3, the first conductive film 35 includes a via wiring film 35a electrically connected to the lower wiring layer 36 through first and second barrier metal films 34a and 34b and an upper wiring film 35b provided on the via wiring film 35a. In the following, the via wiring film 35a and the upper wiring film 35b may be simply described as the first conductive film 35 without distinguishing between them.

In the example shown in FIG. 3, the first barrier metal film 34a, the second barrier metal film 34b and the first conductive film 35 are provided in the first trench M1, but may be provided continuously up to the periphery of the first trench M1.

Here, the configuration and conditions in the vicinity of the upper wiring layer 33 of the first connection wiring layer 32 for improving the reliability while reducing the wiring resistance of the semiconductor device 1 will be described.

As already mentioned, the barrier metal film containing Ti as a main component is low in cost and highly reliable due to the diffusion of the barrier metal film material itself into the Cu wiring, however, moisture in the interlayer insulating film oxidizes Ti in the barrier metal film during high-temperature processing after film formation, resulting in an increase in the resistance value of the wiring of the semiconductor device. On the other hand, Ta itself, which is generally used as the barrier metal film, does not oxidize, but does not diffuse into the Cu wiring, so it cannot sufficiently suppress the migration of the Cu wiring, therefore, the reliability of the semiconductor device becomes lower than when Ti is selected as the material of the barrier metal film.

Figure 4:
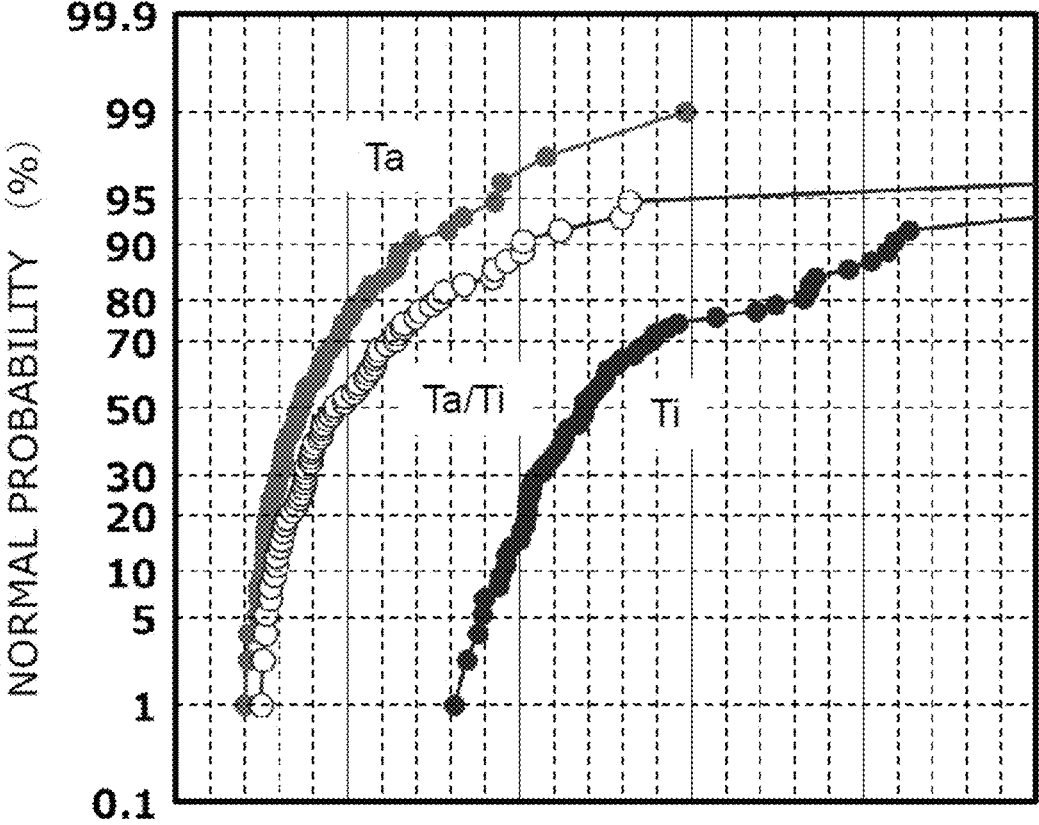
FIG. 4 is an explanatory diagram showing a relationship between a resistance value of one via and a normal probability.

FIG. 4 is an explanatory diagram showing the relationship between the resistance value of one via and the normal probability. In FIG. 4, as an example, the measurement results of a Cu via having a first barrier metal film (Ta film having a thickness of 10 nm) and a second barrier metal film (Ti film having a thickness of 5 nm) is shown. Furthermore, as comparative examples, a measurement results of a Cu via sample provided with only a Ta film having a thickness of 20 nm as the barrier metal film, and a Measurement results of a Cu via sample provided with only a Ti film having a thickness of 20 nm as the barrier metal fil are also shown.

As shown in this FIG. 4, for example, regarding the barrier metal film containing Ti as a main component, which is a comparative example, moisture in the interlayer insulating film oxidizes Ti in the barrier metal film in the high-temperature treatment after film formation. Therefore, the via resistance tends to increase. Furthermore, the barrier metal film containing Ta as a main component, which is a comparative example, is not oxidized even by high-temperature treatment after film formation. Therefore, the via resistance tends to be kept low.

On the other hand, in the Cu via provided with the first barrier metal film (Ta film with a thickness of 10 nm) and the second barrier metal film (Ti film with a thickness of 5 nm), the first barrier metal film containing Ta as a main component suppresses moisture in the interlayer insulating film from reaching the second barrier metal film containing Ti as a main component, therefore the oxidation of the second barrier metal film is suppressed, and the resistance of the via can be kept low.

Figure 5:
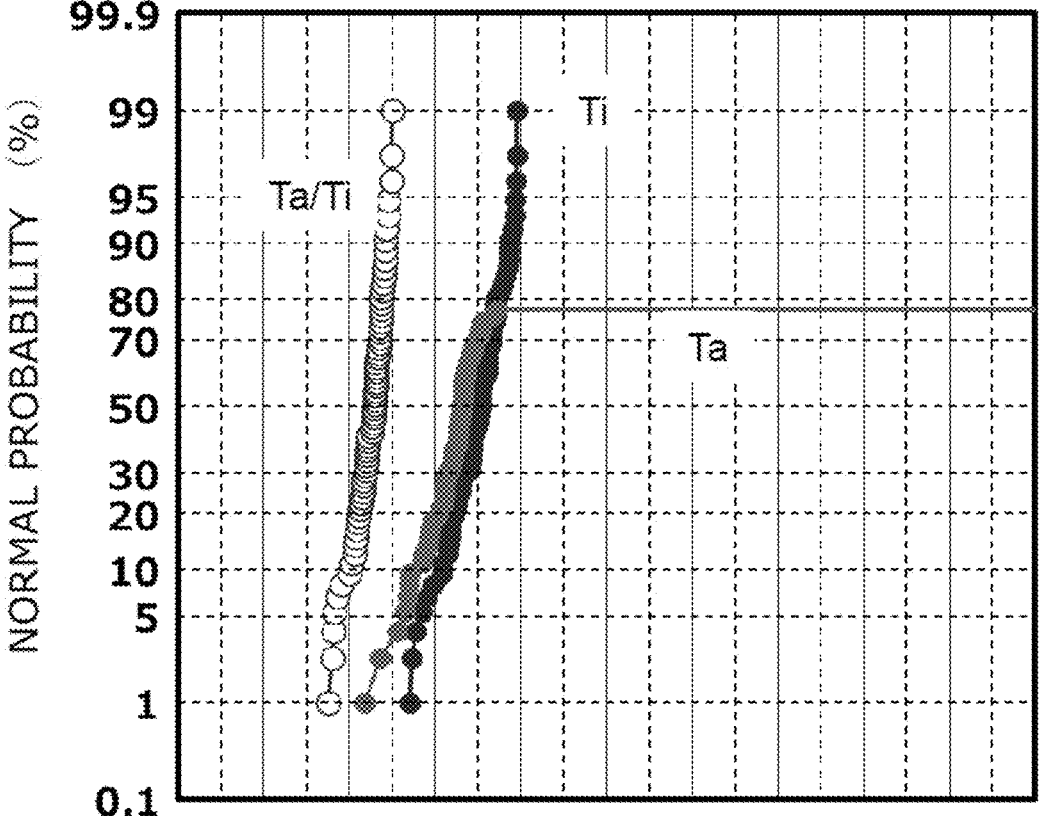
FIG. 5 is an explanatory diagram showing the relationship between the resistance values of a plurality of vias connected by wiring and the normal probability thereof.

Next, FIG. 5 is an explanatory diagram showing the relationship between the resistance values of a plurality of vias connected by wiring and the normal probability. In addition, in this FIG. 5, under predetermined heating conditions, as an example, the measurement results of a plurality of connected vias of Cu having a first barrier metal film (Ta film with a thickness of 10 nm) and a second barrier metal film (Ti film with a thickness of 5 nm) are shown. Furthermore, under the same heating conditions, as a comparative example, the measurement results of a sample of a plurality of Cu-connected vias provided with only a Ta film having a thickness of 20 nm as the barrier metal film, and the measurement results for a sample of Cu connected vias with only a Ti film having a thickness of 20 nm as the barrier metal film are also shown.

As shown in this FIG. 5, for example, in the barrier metal film containing Ti as a main component, which is a comparative example, the Ti in the barrier metal film diffuses into the Cu via, thereby suppressing the migration of Cu, the via resistance tends to be suppressed, as a result, a decrease in reliability can be suppressed. In addition, since the barrier metal film containing Ta as the main component, which is a comparative example, does not suppress the occurrence of Cu migration, the occurrence of migration tends to increase via resistance, and as a result, the reliability is lowered.

On the other hand, in the Cu via provided with the first barrier metal film (Ta film with a thickness of 10 nm) and the second barrier metal film (Ti film with a thickness of 5 nm), the occurrence of Cu migration is suppressed, by diffusing Ti of the second barrier metal film into the Cu via, and as a result, deterioration in reliability can be suppressed.

In particular, in the semiconductor device 1 according to this embodiment, for example, the first barrier metal film 34a is formed to have a thickness of 10 nm or more, and the second barrier metal film 34b is formed to have a thickness of 5 nm or less. In this case, the first barrier metal film 34a and the second barrier metal film 34b are amorphous.

Thus, since the second barrier metal film 34b containing Ti as a main component is formed on the first barrier metal film 34a containing Ta as a main component, it is possible to reduce the thickness of the second barrier metal film 34b. As a result, it is possible to suppress diffusion of Ti into the Cu conductive film due to heat more than necessary, so that it is possible to realize a low resistance wiring.

Then, as described above, in the semiconductor device 1 according to this embodiment, the upper wiring layer 3 includes: a first barrier metal film 34a provided in the first trench M1 and containing Ta as a main component, a second barrier metal film 34b formed in the first trench M1 via the first barrier metal film 34a and containing Ti as a main component, and a first conductive film 35 provided in the first trench M1 via a first barrier metal film 34a and a second barrier metal film 34b and containing a first metal as a main component. In particular, Ti contained in the second barrier metal film 34b is diffused into the first conductive film 35.

As a result, it is possible to suppress the occurrence of migration of Cu forming the first conductive film 35.

That is, the semiconductor device 1 according to the present embodiment can improve reliability while reducing wiring resistance.

[Method for Manufacturing a Semiconductor Device]

Next, as described above, referring to FIGS. 6 and 7, a method for manufacturing the semiconductor device 1 according to the first embodiment will be described. FIGS. 6 to 7 are explanatory diagrams showing the manufacturing process of the semiconductor device 1 according to the first embodiment.

The manufacturing process of the device layer 21 of the second substrate 2 and the device layer 31 of the first substrate 3 are the same as those of a general semiconductor device. Also, the process of forming the second connection wiring layer 22 on the side of the second substrate 2 and the process of forming the first connection wiring layer 32 on the side of the first substrate 3 are similarly described.

Figure 6A:
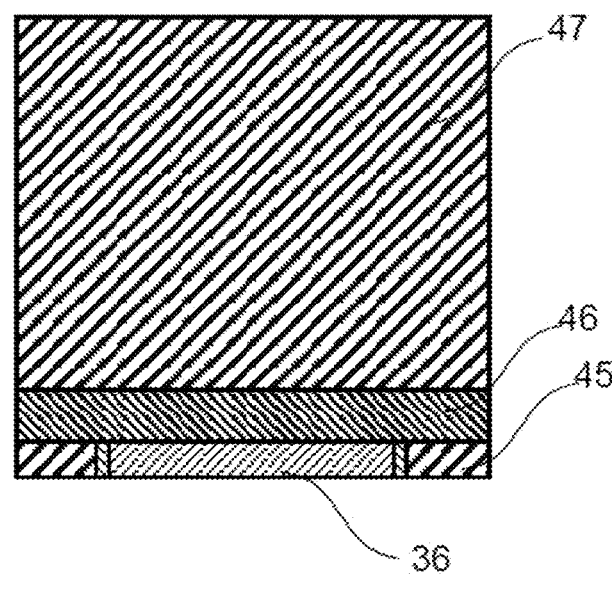
FIGS. 6A to 6C are explanatory diagrams showing a manufacturing process of the semiconductor device according to the first embodiment.

For example, when manufacturing the first substrate 3 shown in FIGS. 1 and 2, first, a silicon oxide layer (first interlayer insulating film) 45 is formed on the surface of the device layer 31 by, for example, CVD (Chemical Vapor Deposition), as shown in FIG. 6A. Then, on the surface of the silicon oxide layer 45, a wiring (lower wiring layer) 36 mainly composed of Cu, for example, is formed by the damascene method.

Thereafter, for example, by CVD, a SiCN film 46 and a silicon oxide layer 47 are sequentially stacked on the silicon oxide layer 45 in which the wiring 36 is embedded, thereby forming a second interlayer insulating film (FIG. 6A).

Figure 6B:
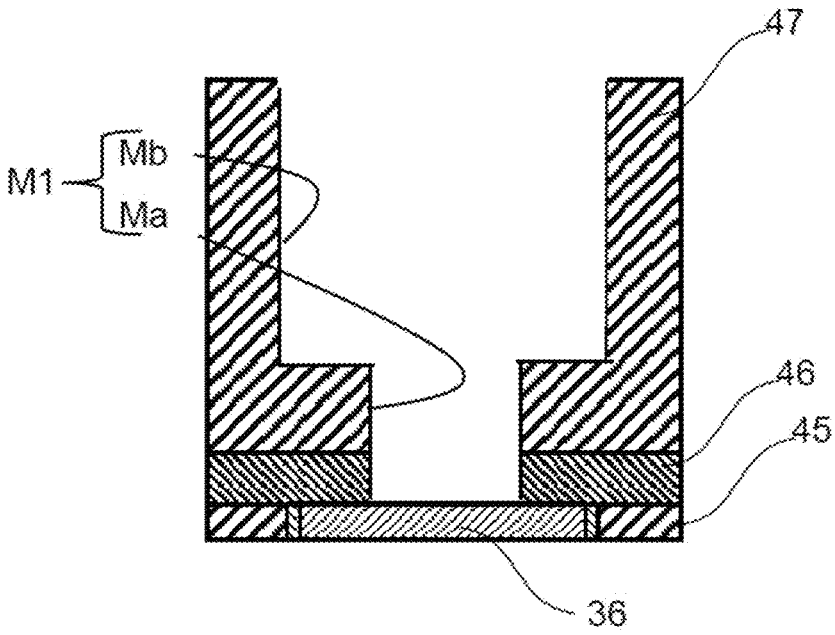

Subsequently, as shown in FIG. 6B, a first trench M1 having the same shape as the upper wiring layer 33 is formed at the position where the upper wiring layer 33 (see FIG. 3)

is to be formed. In this step, first, a resist (not shown) is formed on the silicon oxide layer 47, and an opening having a diameter smaller than the width of the wiring 36 is formed in the resist at the position where the upper wiring layer 33 is to be formed.

Then, by using the resist with the openings as a mask and performing RIE (Reactive Ion Etching), the via hole Ma reaching from the surface of the silicon oxide layer 47 to the surface of the SiCN film 46 is formed.

After that, the diameter of the opening formed in the resist is expanded, for example, to the same extent as the width of the lower wiring layer 36, then a trench Mb for wiring or a pad electrode is formed by enlarging the diameter of the via hole Ma, from the surface of the silicon oxide film 47 to about the center of the thickness direction of the silicon oxide layer 47, by performing RIE again. The via hole Ma reaches the surface of the wiring 36 when forming the trench Mb. As a result, the first trench M1 having the shape shown in FIG. 6B is formed.

Thus, the second interlayer insulating film (SiCN film 46, silicon oxide film 47) with the first trench M1 formed therein is formed on the first interlayer insulating film 45.

Figure 6C:
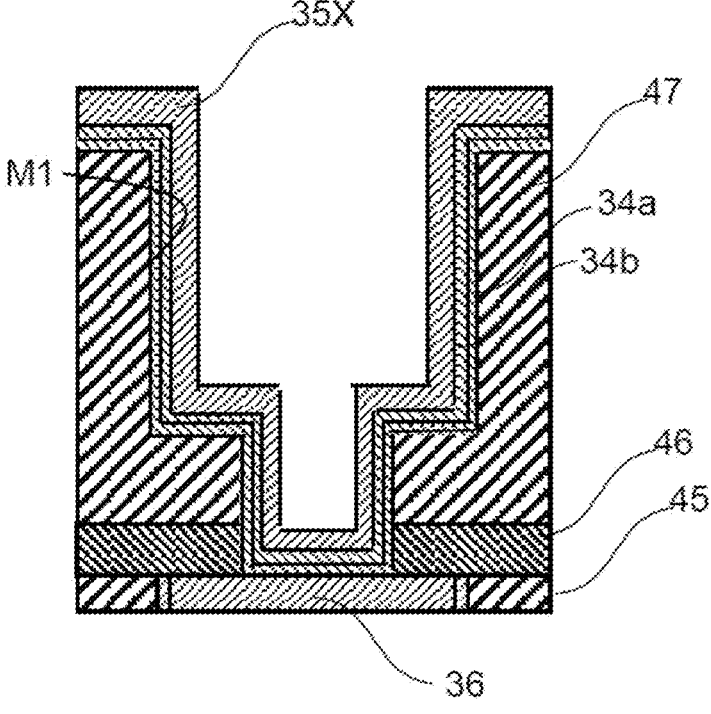

Subsequently, as shown in FIG. 6C, for example, by a PVD (Physical Vapor Deposition) method or a sputtering method, the inner peripheral surface of the first trench M1 and the surface of the silicon oxide layer 47 are covered with a Ta thin film, in order to form the first barrier metal film 34a containing Ta. Furthermore, by coating the first barrier metal film 34a with a thin Ti film by PVD or sputtering, a second barrier metal film 34b containing Ti as a main component is formed.

More preferably, the first barrier metal film 34a and the second barrier metal film 34b are formed in the same apparatus under continuous high vacuum.

Also, for example, as described above, the first barrier metal film 34a is formed to have a film thickness of 10 nm or more, and the second barrier metal film 34b is formed to have a film thickness of 5 nm or less. In this case, the first barrier metal film 34a and the second barrier metal film 34b are amorphous.

Subsequently, a seed film 35X is formed by forming a Cu film on the surface of the second barrier metal film 34b by, e.g., PVD or sputtering (FIG. 6C).

More preferably, the seed film 35X is formed in the same apparatus and under a continuous high vacuum as in the case of forming the first barrier metal film 34a and the second barrier metal film 34b.

Figure 7A:
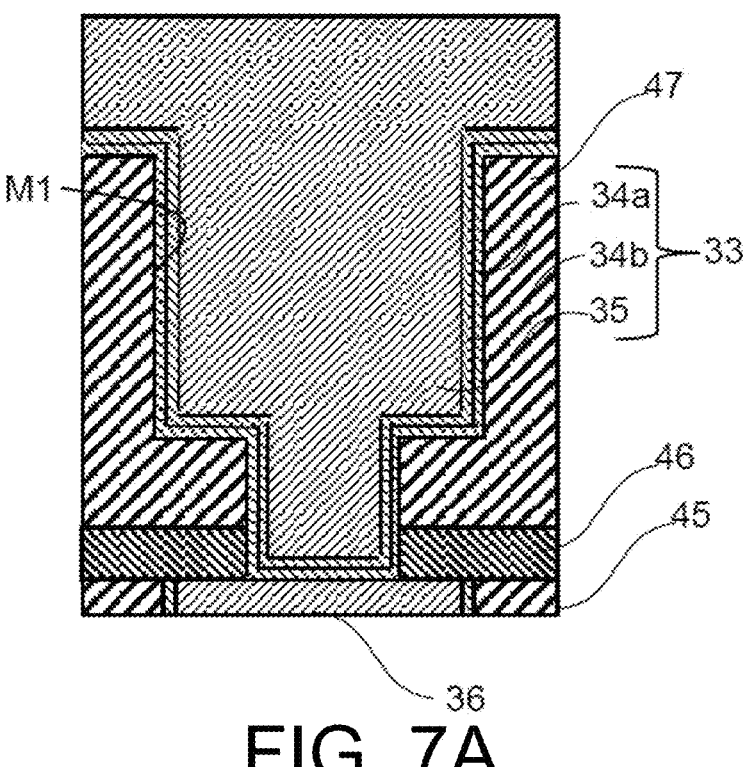
FIGS. 7A to 7C are explanatory diagrams showing the manufacturing process of the semiconductor device according to the first embodiment.

After that, as shown in FIG. 7A, Cu is deposited on the surface of the seed film 35X shown in FIG. 6C, for example, by electrolytic plating. Thus, a first conductive film 35 containing Cu is formed (FIG. 7A).

Figure 7B:
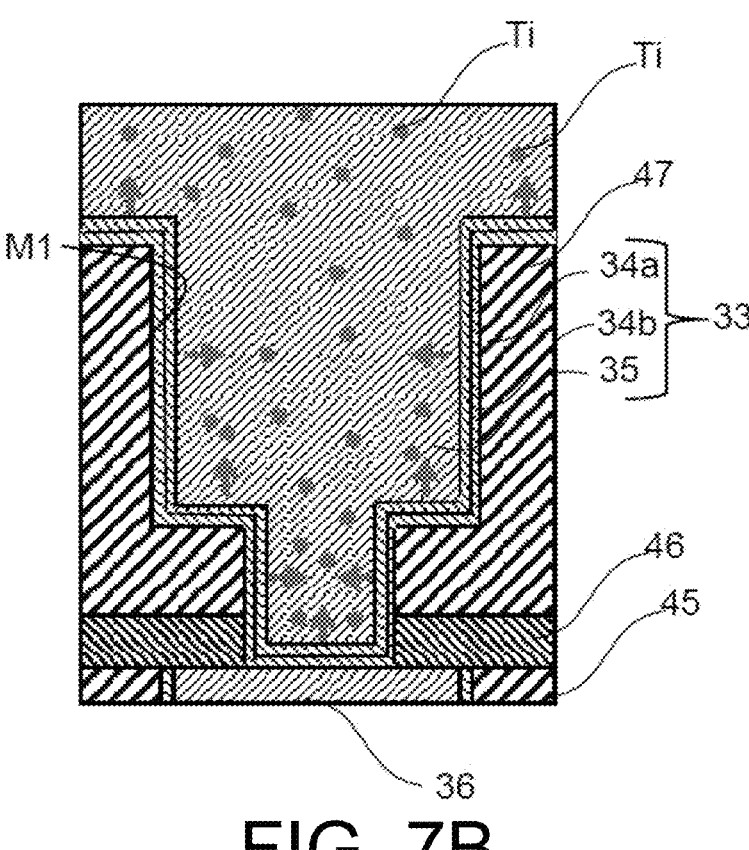

After that, as shown in FIG. 7B, after Cu is deposited, an annealing treatment is performed to diffuse Ti atoms of the second barrier metal film 34b into the first conductive film 34 containing Cu.

Thus, the upper wiring layer 33 is formed so as to include a first barrier metal film 34a provided in the first trench M1 and containing Ta as a main component, a second barrier metal film 34b formed in the first trench M1 via the first barrier metal film 34a and containing Ti as a main component, and a first conductive film 35 provided in the first trench M1 via a first barrier metal film 34a and a second barrier metal film 34b and containing a first metal (Cu) as a main component. In particular, Ti of the second barrier metal film 34b diffuses into the first conductive film 35 due to the annealing treatment.

Figure 7C:
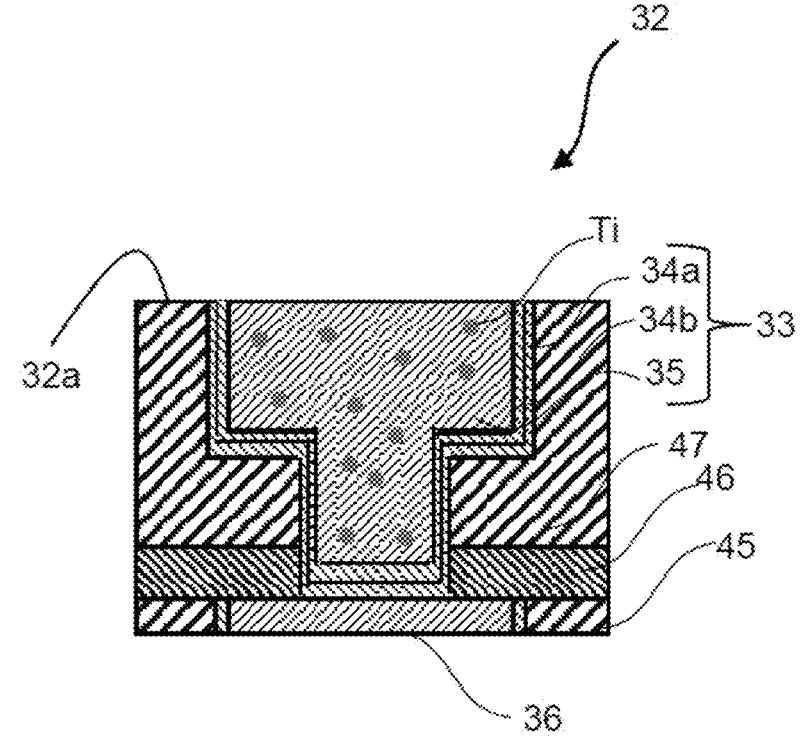

Subsequently, by polishing the surface of the first substrate 3 whose surface is coated with Cu, for example, by a CMP (Chemical Mechanical Polishing) method, as shown FIG. 7C, the upper portion of the first conductive film 35 containing unnecessary Cu and Ti on the silicon oxide film 47 is removed.

Thus, the upper wiring layer 33 electrically connected to the lower wiring layer 36 via the first and second barrier metal films 34a and 34b is formed in the first trench M1 of the second interlayer insulating film 47.

That is, the configuration of the semiconductor device 1 as shown in FIG. 3 is completed by the above steps. Therefore, in the semiconductor device 1 according to this embodiment, the upper wiring layer 3 includes: a first barrier metal film 34a provided in the first trench M1 and containing Ta as a main component, a second barrier metal film 34b formed in the first trench M1 via the first barrier metal film 34a and containing Ti as a main component, and a first conductive film 35 provided in the first trench M1 via a first barrier metal film 34a and a second barrier metal film 34b and containing a first metal as a main component.

In particular, Ti contained in the second barrier metal film 34b is diffused into the first conductive film 35. Thereby, occurrence of migration of Cu constituting the first conductive film 35 can be suppressed.

As described above, according to the semiconductor device 1 according to the first embodiment, it is possible to improve the reliability while reducing the wiring resistance.

Here, in the above-described first embodiment, in particular, an example of the configuration near the upper wiring layer 33 of the first connection wiring layer 32 has been described. However, the configuration near the upper wiring layer 33 is not limited to this. Therefore, other examples of the configuration near the upper wiring layer 33 will be described in the following second to fifth embodiments.

Second Embodiment

Figure 8:
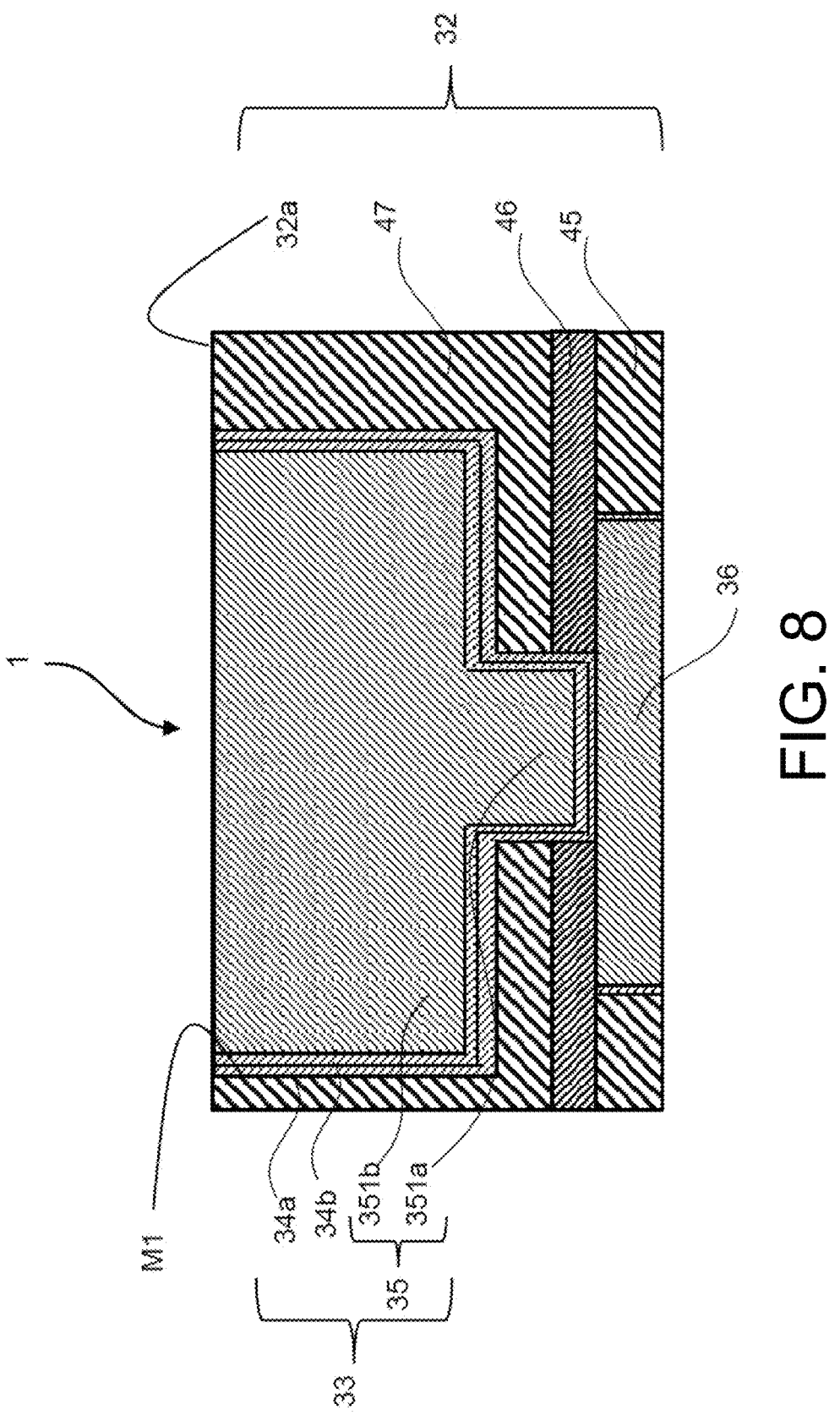
FIG. 8 is an explanatory diagram showing a cross-sectional structure of a semiconductor device according to a second embodiment.

With reference to FIG. 8, a semiconductor device according to the second embodiment will be described. FIG. 8 is an explanatory diagram showing the cross-sectional structure of the semiconductor device according to the second embodiment. In the following description, among the constituent elements shown in FIG. 8, the same constituent elements as those shown in FIG. 3 are denoted by the same reference numerals as those shown in FIG. 3, and the explanation thereof is omitted. The overall configuration of the semiconductor device shown in FIG. 8 of the second embodiment is similar to, for example, the semiconductor device 1 shown in FIGS. 1 and 2 of the first embodiment.

In this second embodiment, W may be used as the first metal that is the main component of the first conductive film 35. That is, as shown in FIG. 8, the first conductive film 35 may include a via wiring film 351a electrically connected to the lower wiring layer 36 through the first and second barrier metal films 34a and 34b and containing W as a main component, and an upper wiring film 351b provided on the via wiring film 351a and containing W as a main component.

Although the Ti of the second barrier metal film 34b does not diffuse into the first conductive film 35 containing W as the main component, because W itself is a material that does not easily cause migration, the reliability of the semiconductor device 1 can be improved.

Furthermore, since the first barrier metal film 34a containing Ta as a main component exists between the second barrier metal film 34b containing Ti as a main component and the second interlayer insulating films 46 and 47, moisture in the second interlayer insulating films 46 and 47 is suppressed from reaching the second barrier metal film 34*b* containing Ti as a main component. That is, in the second barrier metal film 34*b* containing Ti as a main component, the oxidation due to moisture in the second interlayer insulating film 47 is suppressed, and the resistance value can be reduced.

Other configurations of the semiconductor device of the second embodiment are the same as those of the semiconductor device 1 of the first embodiment.

That is, according to the semiconductor device according to the second embodiment, reliability can be improved while reducing wiring resistance.

Third Embodiment

Figure 9:
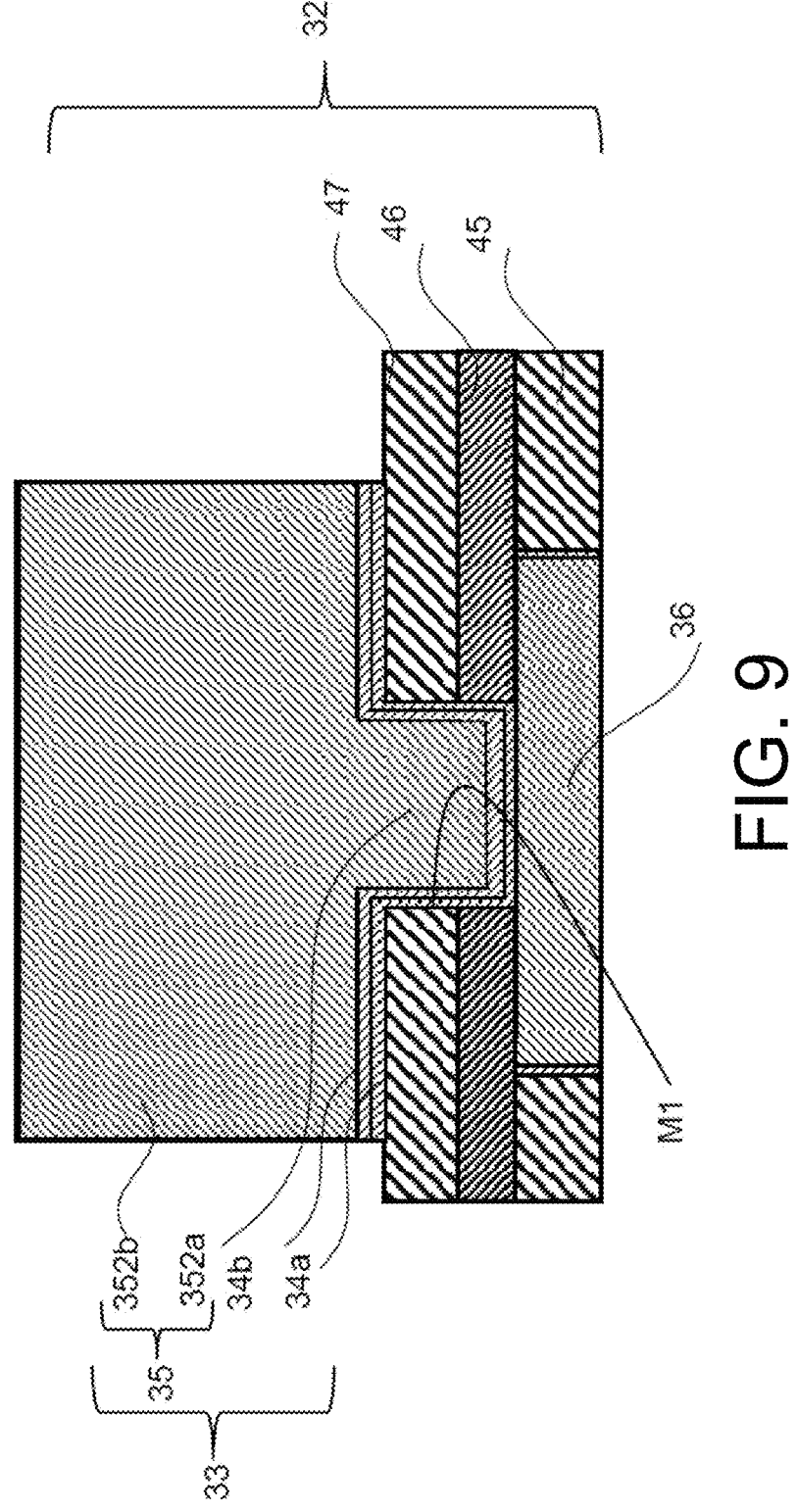
FIG. 9 is an explanatory diagram showing a cross-sectional structure of a semiconductor device according to a third embodiment.

Next, referring to FIG. 9, a semiconductor device according to the third embodiment will be described. FIG. 9 is an explanatory diagram showing the cross-sectional structure of the semiconductor device according to the third embodiment. In the following description, among the constituent elements shown in FIG. 9, the constituent elements that are the same as the constituent elements shown in FIG. 3 are given the same reference numerals as those shown in FIG. 3, and the explanation thereof is omitted. The overall configuration of the semiconductor device shown in FIG. 9 of the third embodiment is similar to, for example, the semiconductor device 1 shown in FIGS. 1 and 2 of the first embodiment.

In the third embodiment, the first metal, which is the main component of the first conductive film 35, may be Al. That is, as shown in FIG. 9, the first conductive film 35 may include a via wiring film 352*a* electrically connected to the lower wiring layer 36 through the first and second barrier metal films 34*a* and 34*b* and containing Al as a main component, and an upper wiring film 35*b* provided on the via wiring film 35*a* and containing Al as a main component. In particular, the Ti contained in the second barrier metal film 34*b* is diffused in the first conductive film 35 containing Al as the main component. As a result, since the Ti of the second barrier metal film 34*b* suppresses the migration of the first conductive film 35 mainly composed of Al, the reliability of the semiconductor device 1 can be improved.

Furthermore, since the first barrier metal film 34*a* containing Ta as a main component exists between the second barrier metal film 34*b* containing Ti as a main component and the second interlayer insulating films 46 and 47, moisture in the second interlayer insulating films 46 and 47 is suppressed from reaching the second barrier metal film 34*b* containing Ti as a main component. That is, in the second barrier metal film 34*b* containing Ti as a main component, the oxidation due to moisture in the second interlayer insulating films 46 and 47 is suppressed, and the resistance value can be reduced.

Other configurations of the semiconductor device of the third embodiment are the same as those of the semiconductor device 1 of the first embodiment.

That is, according to the semiconductor device according to the third embodiment, it is possible to improve the reliability while reducing the wiring resistance.

Fourth Embodiment

Figure 10:
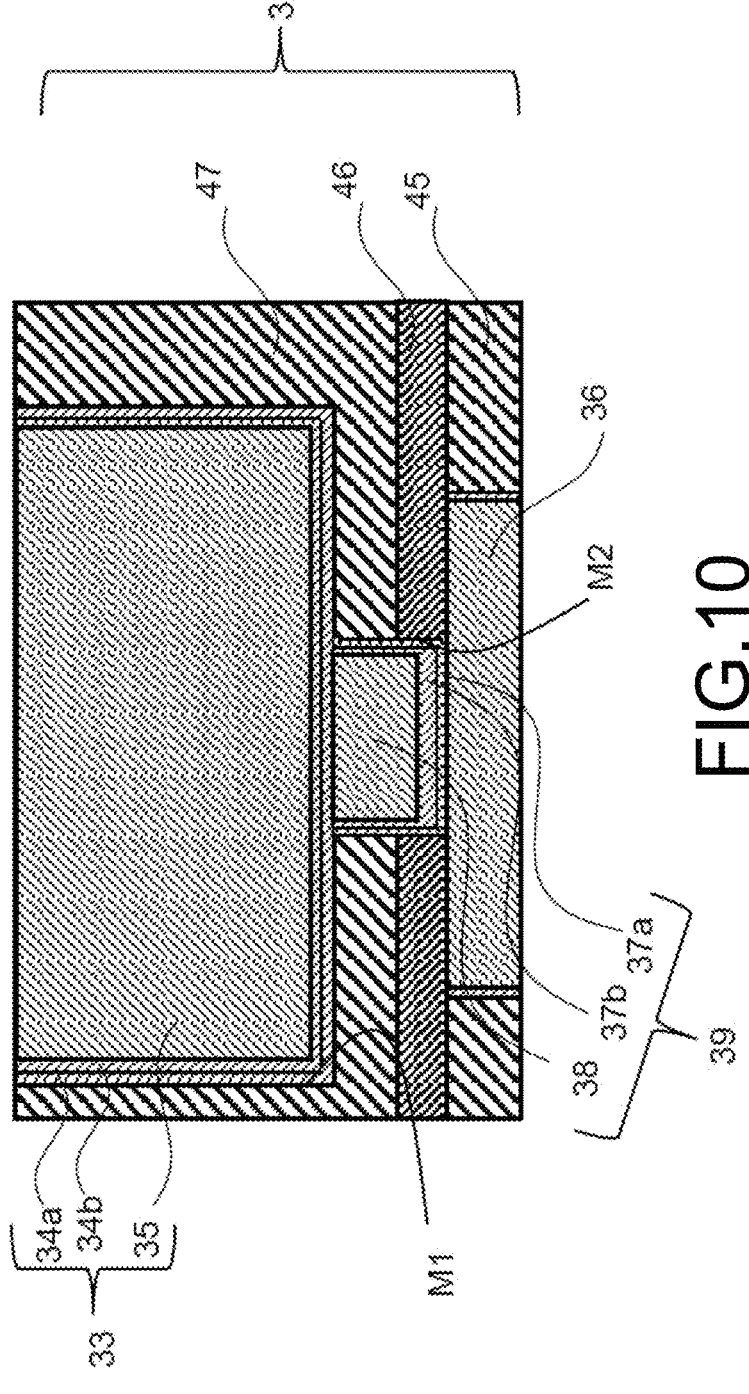
FIG. 10 is an explanatory diagram showing a cross-sectional structure of a semiconductor device according to a fourth embodiment.

Next, referring to FIG. 10, a semiconductor device according to the fourth embodiment will be described. FIG. 10 is an explanatory diagram showing the cross-sectional structure of the semiconductor device according to the fourth embodiment. In the following description, among the components shown in FIG. 10, the same components as those shown in FIG. 3 are denoted by the same reference numerals as those shown in FIG. 3, and the explanation thereof is omitted. The overall configuration of the semiconductor device shown in FIG. 10 of the fourth embodiment is similar to, for example, the semiconductor device 1 shown in FIGS. 1 and 2 of the first embodiment.

As shown in this FIG. 10, the semiconductor device according to the fourth embodiment may further include a via wiring layer 39 provided between the lower wiring layer 36 and the upper wiring layer 33 and electrically connecting the upper wiring layer 33 and the lower wiring layer 36.

For example, as shown in FIG. 10, the via wiring layer 39 includes a first barrier metal film 37*a*, a second barrier metal film 37*b*, and a second conductive film 38.

The first barrier metal film 37*a* is the barrier metal film provided in the second trench M2 and containing Ta as a main component. The first barrier metal film 37*a* is, for example, a Ta film.

The second barrier metal film 37*b* is the barrier metal film containing Ti as a main component and formed in the second trench M2 via the first barrier metal film 37*a*.

Also, the second conductive film 38 is a conductive film which is provided in the second trench M2 via the first barrier metal film 37*a* and the second barrier metal film 37*b* and is mainly composed of metal. In this embodiment, the metal (main element) that is the main component of the second conductive film 38 is Cu.

Also in the semiconductor device according to the fourth embodiment, Ti in the second barrier metal films 34*b* and 37*b* suppresses the migration of the first conductive film 35 and the second conductive film 38 containing Cu as a main component, and the reliability of the semiconductor device can be improved. Furthermore, in the second barrier metal films 34*b* and 37*b* containing Ti as a main component, oxidation due to moisture in the second interlayer insulating films 46 and 47 is suppressed, and the resistance value can be reduced.

Other configurations of the semiconductor device of the fourth embodiment are the same as those of the semiconductor device 1 of the first embodiment.

That is, according to the semiconductor device according to the fourth embodiment, it is possible to improve the reliability while reducing the wiring resistance.

Fifth Embodiment

Figure 11:
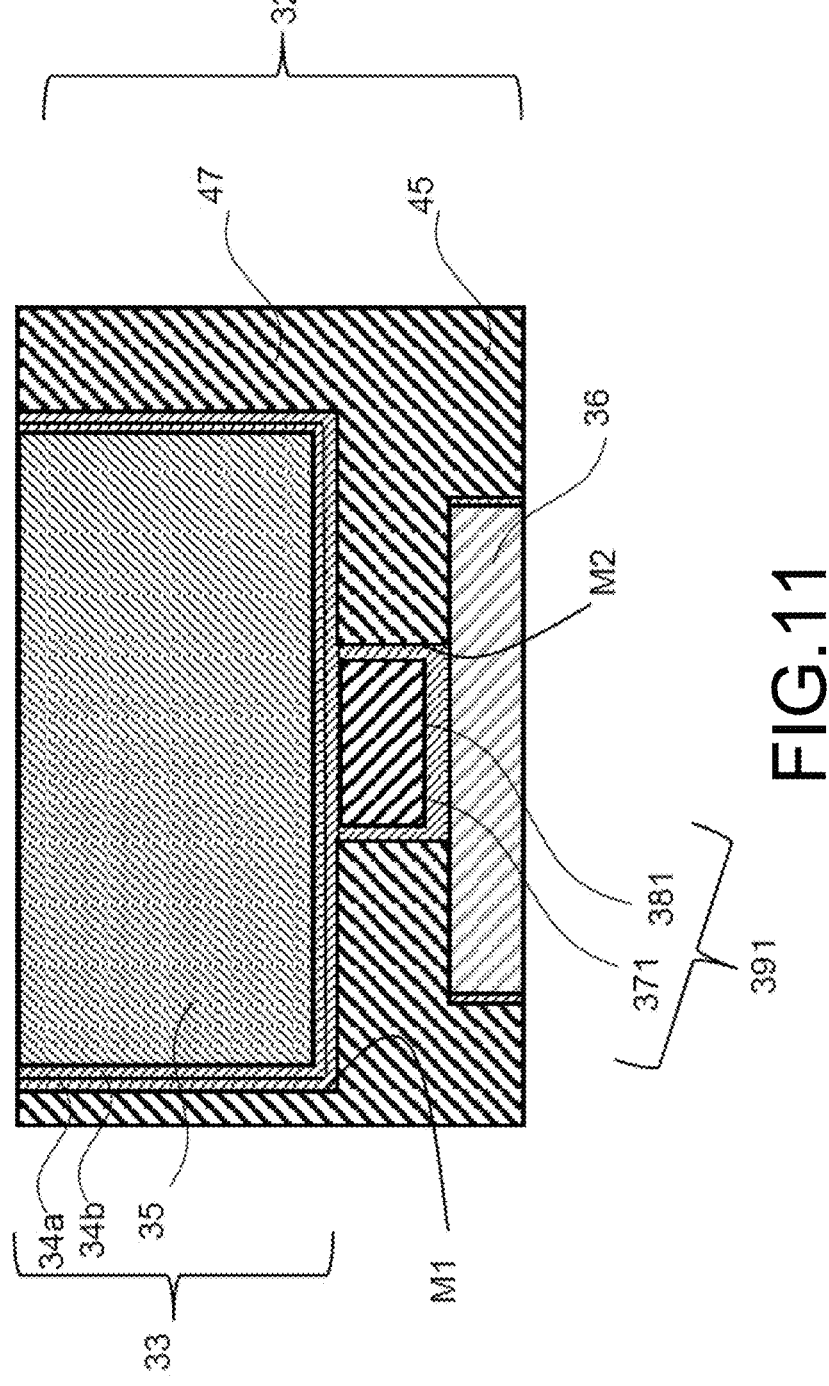
FIG. 11 is an explanatory diagram showing a cross-sectional structure of a semiconductor device according to a fifth embodiment.

Next, referring to FIG. 11, a semiconductor device according to the fifth embodiment will be described. FIG. 11 is an explanatory diagram showing the cross-sectional structure of the semiconductor device according to the fifth embodiment. In the following description, among the components shown in FIG. 11, the same components as those shown in FIG. 3 are denoted by the same reference numerals as those shown in FIG. 3, and the explanation thereof is omitted. The overall configuration of the semiconductor device shown in FIG. 11 of the fifth embodiment is similar to, for example, the semiconductor device 1 shown in FIGS. 1 and 2 of the first embodiment.

As shown in this FIG. 11, the semiconductor device according to the fifth embodiment may further include, for example, a via wiring layer 391 provided between the lower wiring layer 36 and the upper wiring layer 33 containing W as a main component and electrically connecting the upper wiring layer 33 and the lower wiring layer 36.

For example, as shown in FIG. 10, this via wiring layer 391 includes the barrier metal film 371 and a second conductive film 381.

The barrier metal film 371 is the barrier metal film provided in the second trench M2 and containing Ti as a main component. This barrier metal film 371 is, for example, a Ti film or a TiN film.

In addition, the second conductive film 381 is a conductive film which is provided in the second trench M2 via the barrier metal film 371 and is mainly composed of metal. In this embodiment, a metal (main element), that is the main component of the second conductive film 381, is W.

Also in the semiconductor device according to the fifth embodiment, the Ti of the second barrier metal film 34b suppresses the migration of the first conductive film 35 mainly composed of Cu, the reliability of the semiconductor device can be improved. Furthermore, in the second barrier metal film 34b containing Ti as a main component, oxidation due to moisture in the second interlayer insulating film 47 is suppressed, and the resistance value can be reduced.

Other configurations of the semiconductor device of the fifth embodiment are the same as those of the semiconductor device 1 of the first embodiment.

That is, according to the semiconductor device according to the fifth embodiment, it is possible to improve reliability while reducing wiring resistance.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
a first interlayer insulating film;

a lower wiring layer provided in the first interlayer insulating film;
a second interlayer insulating film provided on the first interlayer insulating film and having a first trench provided therein; and
an upper wiring layer provided in the first trench of the second interlayer insulating film and electrically connected to the lower wiring layer,
wherein:
the upper wiring layer comprises:
a first barrier metal film provided in the first trench, and mainly composed of Ta;
a second barrier metal film provided in the first trench via the first barrier metal film, and mainly composed of Ti; and
a first conductive film provided in the first trench via the first barrier metal film and the second barrier metal film, and mainly composed of a first metal,
the first conductive film includes:
a via wiring film electrically connected to the lower wiring layer through the first and second barrier metal films; and
an upper wiring film provided on the via wiring film, and
the first barrier metal film, the second barrier metal film, and the first conductive film are provided in the first trench and are provided continuously up to a periphery of the first trench.

2. The semiconductor device according to claim 1, wherein Ti is present in the first conductive film.

3. The semiconductor device according to claim 1, wherein the first barrier metal film is amorphous.

4. The semiconductor device according to claim 1, wherein the second barrier metal film is amorphous.

5. The semiconductor device according to claim 3, wherein the second barrier metal film is amorphous.

6. The semiconductor device according to claim 1, wherein the first metal, which is a main component of the first conductive film, is W, Al, or Cu.

* * * * *